United States Patent
Terasaki

(10) Patent No.: US 11,638,350 B2
(45) Date of Patent: Apr. 25, 2023

(54) COPPER/CERAMIC BONDED BODY, INSULATING CIRCUIT BOARD, METHOD FOR PRODUCING COPPER/CERAMIC BONDED BODY, AND METHOD FOR PRODUCING INSULATING CIRCUIT BOARD

(71) Applicant: MITSUBISHI MATERIALS CORPORATION, Tokyo (JP)

(72) Inventor: Nobuyuki Terasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 17/770,754

(22) PCT Filed: Dec. 1, 2020

(86) PCT No.: PCT/JP2020/044596
§ 371 (c)(1),
(2) Date: Apr. 21, 2022

(87) PCT Pub. No.: WO2021/112060
PCT Pub. Date: Jun. 10, 2021

(65) Prior Publication Data
US 2022/0353989 A1 Nov. 3, 2022

(30) Foreign Application Priority Data

Dec. 2, 2019 (JP) .............................. JP2019-217926
Nov. 24, 2020 (JP) .............................. JP2020-194519

(51) Int. Cl.
*H05K 1/02* (2006.01)
*H05K 1/09* (2006.01)
(Continued)

(52) U.S. Cl.
CPC ........... *H05K 1/053* (2013.01); *H05K 1/0306* (2013.01); *H05K 3/10* (2013.01); *H05K 2203/101* (2013.01)

(58) Field of Classification Search
CPC .. H05K 1/02; H05K 1/09; H05K 1/18; H05K 1/0201; H05K 1/0203; H05K 1/0271;
(Continued)

(56) References Cited

U.S. PATENT DOCUMENTS 6,020,076 A 2/2000 Fujii et al.
6,106,960 A 8/2000 Fujii et al.
(Continued)

FOREIGN PATENT DOCUMENTS

CN 103733329 A 4/2014
CN 107530780 A 1/2018
(Continued)

OTHER PUBLICATIONS

Notice of Allowance dated Apr. 28, 2022, issued for Korean Patent Application No. 10-2022-7013066 and English translation thereof.
(Continued)

*Primary Examiner* — Xiaoliang Chen
(74) *Attorney, Agent, or Firm* — Locke Lord LLP

(57) ABSTRACT

This copper/ceramic bonded body includes: a copper member made of copper or a copper alloy; and a ceramic member made of nitrogen-containing ceramics, the copper member and the ceramic member are bonded to each other, in which, between the copper member and the ceramic member, an active metal nitride layer containing nitrides of one or more active metals selected from Ti, Zr, Nb, and Hf is formed on a ceramic member side, and a Mg solid solution layer in which Mg is solid-dissolved in a Cu matrix is formed between the active metal nitride layer and the copper member, and Cu-containing particles composed of either one or
(Continued)

both of Cu particles and compound particles of Cu and the active metal are dispersed in an interior of the active metal nitride layer.

8 Claims, 4 Drawing Sheets

(51) Int. Cl.
| | |
|---|---|
| *H05K 1/18* | (2006.01) |
| *H05K 3/10* | (2006.01) |
| *H05K 3/38* | (2006.01) |
| *H01L 23/367* | (2006.01) |
| *H05K 1/05* | (2006.01) |
| *H05K 1/03* | (2006.01) |

(58) Field of Classification Search
CPC ........ H05K 1/0306; H05K 1/053; H05K 3/10; H05K 3/38; H05K 3/103; H05K 3/388; H01L 21/4807; H01L 21/4846; H01L 21/4857; H01L 21/4867; H01L 21/4871; H01L 21/4882; H01L 23/367; H01L 23/3672; H01L 23/3733; H01L 23/3735; H01L 23/4924
USPC ...... 361/784; 174/258, 260; 228/124.5, 246, 228/256; 428/553, 564, 662
See application file for complete search history.

(56) References Cited

U.S. PATENT DOCUMENTS

| | | | | |
|---|---|---|---|---|
| 8,342,386 | B2* | 1/2013 | Cretegny | B23K 1/0018 |
| | | | | 228/256 |
| 9,066,433 | B2* | 6/2015 | Kuramitsu | C22C 9/00 |
| 9,401,340 | B2* | 7/2016 | Nishimoto | H01L 25/07 |
| 9,905,437 | B2* | 2/2018 | Terasaki | B23K 35/30 |
| 10,103,035 | B2* | 10/2018 | Terasaki | C04B 37/026 |
| 10,173,282 | B2* | 1/2019 | Terasaki | B23K 26/0006 |
| 10,420,223 | B2* | 9/2019 | Iwazaki | H05K 1/0203 |
| 10,607,915 | B2* | 3/2020 | Oohiraki | B32B 9/041 |
| 11,028,022 | B2* | 6/2021 | Terasaki | H01L 21/4871 |
| 11,062,974 | B2* | 7/2021 | Terasaki | H01L 21/4882 |
| 11,177,186 | B2* | 11/2021 | Terasaki | H05K 3/388 |
| 11,302,602 | B2* | 4/2022 | Yumoto | H01L 23/3735 |
| 11,393,738 | B2* | 7/2022 | Terasaki | H01L 23/3735 |
| 11,476,127 | B2* | 10/2022 | Oohiraki | H01L 24/92 |
| 11,478,868 | B2* | 10/2022 | Yumoto | B23K 1/0016 |
| 2009/0056996 | A1* | 3/2009 | Kato | H05K 1/18 |
| | | | | 174/260 |
| 2015/0208496 | A1* | 7/2015 | Terasaki | C22C 30/04 |
| | | | | 165/185 |
| 2016/0221305 | A1* | 8/2016 | Terasaki | H01L 23/3736 |
| 2016/0358791 | A1 | 12/2016 | Terasaki et al. | |
| 2018/0346387 | A1 | 12/2018 | Terasaki et al. | |
| 2020/0006213 | A1 | 1/2020 | Terasaki | |

FOREIGN PATENT DOCUMENTS

| | | |
|---|---|---|
| EP | 4026820 A1 | 7/2022 |
| EP | 4053091 A1 | 9/2022 |
| JP | 3211856 B2 | 9/2001 |
| JP | 2003-192463 A | 7/2003 |
| JP | 2004-255416 A | 9/2004 |
| JP | 2005-305526 A | 11/2005 |
| JP | 4375730 B2 | 12/2009 |
| JP | 2013-211546 A | 10/2013 |
| JP | 2014-091673 A | 5/2014 |
| JP | 2016-143831 A | 8/2016 |
| JP | 2017-043101 A | 3/2017 |
| JP | 2018-140929 A | 9/2018 |
| JP | 2019-127432 A | 8/2019 |
| KR | 10-1996-0031401 A | 9/1996 |
| KR | 10-1996-0031402 A | 9/1996 |
| KR | 10-2016-0064071 A | 6/2016 |
| KR | 10-2016-0120285 A | 10/2016 |
| KR | 10-2018-0077204 A | 7/2018 |
| WO | 2018/159590 A1 | 9/2018 |
| WO | 2019/146464 A1 | 8/2019 |

OTHER PUBLICATIONS

International Search Report dated Feb. 16, 2021, issued for PCT/JP2020/044596 and English translation thereof.
Office Action dated Aug. 12, 2022, issued for Chinese Patent Application No. 202080078702.5 and English translation of the Search Report.
Supplementary European Search Report dated Dec. 8, 2022, issued for European Patent Application No. 20896666.3.

* cited by examiner

COPPER/CERAMIC BONDED BODY, INSULATING CIRCUIT BOARD, METHOD FOR PRODUCING COPPER/CERAMIC BONDED BODY, AND METHOD FOR PRODUCING INSULATING CIRCUIT BOARD

TECHNICAL FIELD

The present invention relates to a copper/ceramic bonded body in which a copper member made of copper or a copper alloy and a ceramic member made of nitrogen-containing ceramics are bonded to each other, an insulating circuit substrate in which a copper sheet made of copper or a copper alloy is bonded to a surface of a ceramic substrate made of nitrogen-containing ceramics, a method for producing a copper/ceramic bonded body, and a method for producing an insulating circuit substrate.

The present application claims priority on Japanese Patent Application No. 2019-217926 filed on Dec. 2, 2019, and Japanese Patent Application No. 2020-194519 filed on Nov. 24, 2020, the contents of which are incorporated herein by reference.

BACKGROUND ART

A power module, an LED module, and a thermoelectric module have a structure in which a power semiconductor element, an LED element, and a thermoelectric element are bonded to an insulating circuit substrate, and in the insulating circuit substrate, a circuit layer made of a conductive material is formed on one surface of an insulating layer.

For example, a power semiconductor element for high-power control used for controlling a wind power generation, an electric vehicle, a hybrid vehicle, or the like has a large amount of heat generated during operation. Therefore, as a substrate on which the power semiconductor element is mounted, an insulating circuit substrate including a ceramic substrate and a circuit layer formed by bonding a metal plate having excellent conductivity to one surface of the ceramic substrate has been widely used in the related art. As the insulating circuit substrate, one having a metal layer formed by bonding a metal plate to the other surface of the ceramic substrate is also provided.

For example, Patent Document 1 proposes an insulating circuit substrate in which a circuit layer and a metal layer are formed by bonding a copper sheet to each of one surface and the other surface of a ceramic substrate.

In Patent Document 1, the copper sheet is disposed on each of one surface and the other surface of the ceramic substrate with an Ag—Cu—Ti-based brazing material interposed therebetween, and the copper sheet is bonded thereto by performing a heating treatment (so-called active metal brazing method). In the active metal brazing method, since the brazing material containing Ti as an active metal is used, the wettability between the molten brazing material and the ceramic substrate is improved, and the ceramic substrate and the copper sheet are satisfactorily bonded to each other.

Patent Document 2 proposes an insulating circuit substrate in which a ceramic substrate and a copper sheet are bonded to each other by using a Cu—Mg—Ti-based brazing material.

In Patent Document 2, the bonding is performed by heating at a temperature of 560° C. to 800° C. in a nitrogen gas atmosphere, and Mg in a Cu—Mg—Ti alloy is sublimated and does not remain at a bonded interface, while titanium nitride (TiN) is not substantially formed.

PRIOR ART DOCUMENTS

Patent Document

Patent Document 1: Japanese Patent No. 3211856
Patent Document 2: Japanese Patent No. 4375730

DISCLOSURE OF INVENTION

Problems to be Solved by the Invention

By the way, in a high-temperature semiconductor device using SiC or the like, a semiconductor element may be mounted at a high density, and it is necessary to ensure operation at a higher temperature in the insulating circuit substrate used for the device.

Therefore, it is necessary to suppress occurrence of breaking in the ceramic substrate even when a thermal cycle that is more severe than in the related art is loaded.

The present invention has been made in view of the above-described circumstances, and an objective of the present invention is to provide a copper/ceramic bonded body, an insulating circuit substrate, a method for producing a copper/ceramic bonded body, and a method for producing an insulating circuit substrate, which can suppress occurrence of breaking in a ceramic substrate even when severe thermal cycle is loaded, and are excellent in reliability of a thermal cycle.

Solutions for Solving the Problems

In order to solve the above-described problem, a copper/ceramic bonded body according to one aspect of the present invention includes a copper member made of copper or a copper alloy, and a ceramic member made of nitrogen-containing ceramics, the copper member and the ceramic member are bonded to each other, in which, between the copper member and the ceramic member, an active metal nitride layer containing nitrides of one or more active metals selected from Ti, Zr, Nb, and Hf is formed on a ceramic member side, and a Mg solid solution layer in which Mg is solid-dissolved in a Cu matrix is formed between the active metal nitride layer and the copper member, and Cu-containing particles composed of either one or both of Cu particles and compound particles of Cu and the active metal are dispersed in an interior of the active metal nitride layer.

According to the copper/ceramic bonded body of the aspect, since the active metal nitride layer containing the nitrides of one or more active metals selected from Ti, Zr, Nb, and Hf is formed on the ceramic member side, and the Mg solid solution layer in which Mg is solid-dissolved in the Cu matrix is formed between the active metal nitride layer and the copper member, sufficient interfacial reaction proceeds, and the copper member and the ceramic member are firmly bonded to each other.

Since the Cu-containing particles composed of either one or both of the Cu particles and the compound particles of Cu and the active metal are dispersed in the interior of the active metal nitride layer, stress in the hard active metal nitride layer can be relaxed during loading of a thermal cycle, and occurrence of breaking in the ceramic member adjacent to the active metal nitride layer can be suppressed.

In the copper/ceramic bonded body according to the aspect of the present invention, it is preferable that the Cu-containing particles have a particle size in a range of 10 nm or more and 100 nm or less.

In this case, since the Cu-containing particles have the particle size in the range of 10 nm or more and 100 nm or less, a stress relaxation effect in the active metal nitride layer can be sufficiently exerted, and the occurrence of breaking in the ceramic member adjacent to the active metal nitride layer can be further suppressed.

In the copper/ceramic bonded body according to the aspect of the present invention, it is preferable that Mg is present in the interior of the active metal nitride layer.

In this case, the stress relaxation effect in the active metal nitride layer can be obtained by Mg which is present in the interior of the active metal nitride layer, and the occurrence of breaking in the ceramic member adjacent to the active metal nitride layer can be further suppressed.

In the copper/ceramic bonded body according to the aspect of the present invention, it is preferable that a ratio C2/C1 of an average copper concentration C1 (atomic %) in a region from an interface on a ceramic member side to a position of 25% of a total thickness of the active metal nitride layer to an average copper concentration C2 (atomic %) in a region from an interface on a copper member side to a position of 25% of the total thickness of the active metal nitride layer is 0.8 or less.

In this case, in the active metal nitride layer, since the copper concentration on the ceramic member side is higher than the copper concentration on the copper member side, the interfacial reaction sufficiently proceeds, and the copper member and the ceramic member are more firmly bonded to each other.

An insulating circuit substrate according to another aspect of the present invention includes a copper sheet made of copper or a copper alloy, and a ceramic substrate made of nitrogen-containing ceramics, the copper sheet is bonded to a surface of the ceramic substrate, in which, between the copper sheet and the ceramic substrate, an active metal nitride layer containing nitrides of one or more active metals selected from Ti, Zr, Nb, and Hf is formed on a ceramic substrate side, and a Mg solid solution layer in which Mg is solid-dissolved in a Cu matrix is formed between the active metal nitride layer and the copper sheet, and Cu-containing particles composed of either one or both of Cu particles and compound particles of Cu and the active metal are dispersed in an interior of the active metal nitride layer.

According to the insulating circuit substrate of the aspect, since the active metal nitride layer containing the nitrides of one or more active metals selected from Ti, Zr, Nb, and Hf is formed on the ceramic substrate side, and the Mg solid solution layer in which Mg is solid-dissolved in the Cu matrix is formed between the active metal nitride layer and the copper sheet, a sufficient interfacial reaction proceeds, and the copper sheet and the ceramic substrate are firmly bonded to each other.

Since the Cu-containing particles composed of either one or both of the Cu particles and the compound particles of Cu and the active metal are dispersed in the interior of the active metal nitride layer, stress in the hard active metal nitride layer can be relaxed during loading of a thermal cycle, and occurrence of breaking in the ceramic substrate adjacent to the active metal nitride layer can be suppressed.

In the insulating circuit substrate according to the aspect of the present invention, it is preferable that the Cu-containing particles have a particle size in a range of 10 nm or more and 100 nm or less.

In this case, since the Cu-containing particles have the particle size in the range of 10 nm or more and 100 nm or less, a stress relaxation effect in the active metal nitride layer can be sufficiently exerted, and the occurrence of breaking in the ceramic substrate adjacent to the active metal nitride layer can be further suppressed.

In the insulating circuit substrate according to the aspect of the present invention, it is preferable that Mg is present in the interior of the active metal nitride layer.

In this case, the stress relaxation effect in the active metal nitride layer can be obtained by Mg which is present in the interior of the active metal nitride layer, and the occurrence of breaking in the ceramic substrate adjacent to the active metal nitride layer can be further suppressed.

In the insulating circuit substrate according to the aspect of the present invention, it is preferable that a ratio C2/C1 of an average copper concentration C1 (atomic %) in a region from an interface on a ceramic substrate side to a position of 25% of a total thickness of the active metal nitride layer to an average copper concentration C2 (atomic %) in a region from an interface on a copper sheet side to a position of 25% of the total thickness of the active metal nitride layer is 0.8 or less.

In this case, in the active metal nitride layer, since the copper concentration on the ceramic substrate side is higher than the copper concentration on the copper sheet side, the interfacial reaction sufficiently proceeds, and the copper sheet and the ceramic substrate are more firmly bonded to each other.

A method for producing a copper/ceramic bonded body according to still another aspect of the present invention is a method for producing the copper/ceramic bonded body described above, the method includes: an active metal and Mg disposing step of disposing one or more active metals selected from Ti, Zr, Nb, and Hf and Mg between a copper member and a ceramic member; a laminating step of laminating the copper member and the ceramic member with the active metal and Mg interposed therebetween; and a bonding step of performing a heating treatment on the laminated copper member and ceramic member with the active metal and Mg interposed therebetween in a state of being pressed in a lamination direction under a vacuum atmosphere to bond the copper member and the ceramic member to each other, in which, in the active metal and Mg disposing step, an amount of the active metal is set to be in a range of 0.4 $\mu mol/cm^2$ or more and 18.8 $\mu mol/cm^2$ or less, and an amount of Mg is set to be in a range of 14 $\mu mol/cm^2$ or more and 86 $\mu mol/cm^2$ or less, and in the bonding step, heating is held at an intermediate temperature of 440° C. or higher and lower than 480° C. for 30 minutes or longer and 150 minutes or shorter, and then heating is held at a temperature of 700° C. or higher for 15 minutes or longer.

According to the method for producing a copper/ceramic bonded body of the aspect, in the active metal and Mg disposing step, the amount of the active metal is set to be in the range of 0.4 $mmol/cm^2$ or more and 18.8 $mmol/cm^2$ or less, and the amount of Mg is set to be in the range of 14 $mol/cm^2$ or more and 86 $mol/cm^2$ or less, so that a sufficient liquid phase required for an interfacial reaction can be obtained. Accordingly, the copper member and the ceramic member can be reliably bonded to each other.

In the bonding step, the heating is held at the intermediate temperature of 440° C. or higher and lower than 480° C. for 30 minutes or longer and 150 minutes or shorter, so that, when the heating is held at the intermediate temperature, a decomposition reaction of the ceramics proceeds in a solid phase state, a liquid phase locally containing Mg is generated, and Mg enters the interior of the ceramic member.

Since the heating is held at the temperature of 700° C. or higher for 15 minutes or longer after being held at the intermediate temperature, the active metal nitride layer is formed. In addition, in the interior of the ceramic member, a Cu—Mg liquid phase is formed starting from a portion where Mg enters, Cu enters into the interior of the ceramic member, and the Cu-containing particles are dispersed.

A method for producing an insulating circuit substrate according to still another aspect of the present invention is a method for producing the insulating circuit substrate described above, the method includes: an active metal and Mg disposing step of disposing one or more active metals selected from Ti, Zr, Nb, and Hf and Mg between a copper sheet and a ceramic substrate; a laminating step of laminating the copper sheet and the ceramic substrate with the active metal and Mg interposed therebetween; and a bonding step of performing a heating treatment on the laminated copper sheet and ceramic substrate with the active metal and Mg interposed therebetween in a state of being pressed in a lamination direction under a vacuum atmosphere to bond the copper sheet and the ceramic substrate to each other, in which in the active metal and Mg disposing step, an amount of the active metal is set to be in a range of 0.4 mol/cm$^2$ or more and 18.8 µmol/cm$^2$ or less, and an amount of Mg is set to be in a range of 14 µmol/cm$^2$ or more and 86 mol/cm$^2$ or less, and in the bonding step, heating is held at an intermediate temperature of 440° C. or higher and lower than 480° C. for 30 minutes or longer and 150 minutes or shorter, and then heating is held at a temperature of 700° C. or higher for 15 minutes or longer.

According to the method for producing an insulating circuit substrate of the aspect, in the active metal and Mg disposing step, the amount of the active metal is set to be in the range of 0.4 µmol/cm$^2$ or more and 18.8 µmol/cm$^2$ or less, and the amount of Mg is set to be in the range of 14 µmol/cm$^2$ or more and 86 µmol/cm$^2$ or less, so that a sufficient liquid phase required for an interfacial reaction can be obtained. Accordingly, the copper sheet and the ceramic substrate can be reliably bonded to each other.

In the bonding step, the heating is held at the intermediate temperature of 440° C. or higher and lower than 480° C. for 30 minutes or longer and 150 minutes or shorter, so that, when the heating is held at the intermediate temperature, a decomposition reaction of the ceramics proceeds in a solid phase state, a liquid phase locally containing Mg is generated, and Mg enters the interior of the ceramic substrate.

Since the heating is held at the temperature of 700° C. or higher for 15 minutes or longer after being held at the intermediate temperature, a Cu—Mg liquid phase is formed starting from a portion where Mg enters, Cu enters the interior of the ceramic substrate, and the Cu-containing particle are dispersed.

Effects of Invention

According to the aspects of the present invention, it is possible to provide a copper/ceramic bonded body, an insulating circuit substrate, a method for producing a copper/ceramic bonded body, and a method for producing an insulating circuit substrate, which can suppress occurrence of breaking in a ceramic substrate even when severe thermal cycle is loaded, and are excellent in reliability of a thermal cycle.

EMBODIMENTS FOR CARRYING OUT THE INVENTION

Hereinafter, an embodiment of the present invention will be described with reference to the accompanying drawings.

Figure 1:
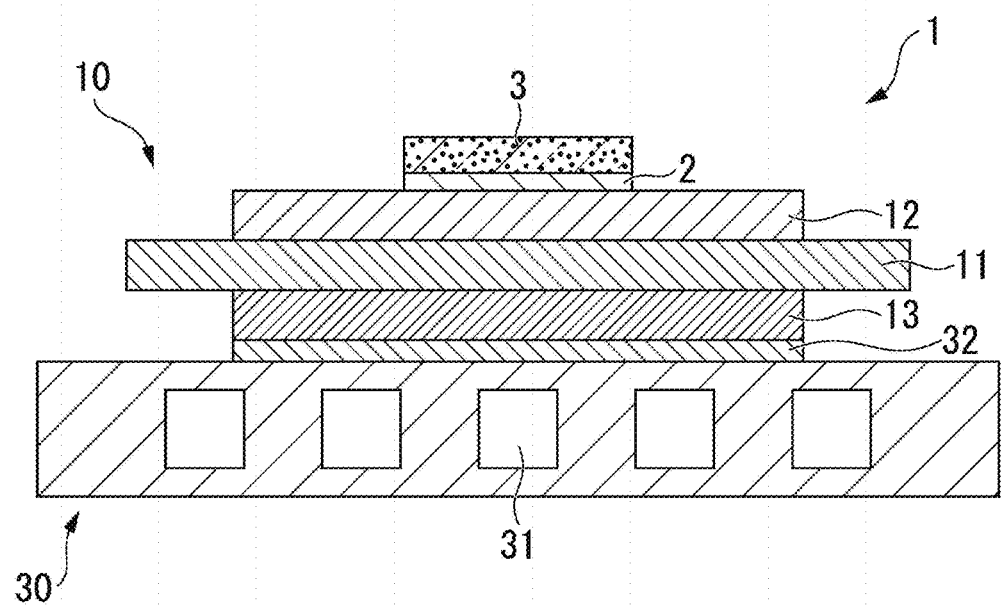
FIG. 1 is a schematic explanatory view of a power module using an insulating circuit substrate according to an embodiment of the present invention.

A copper/ceramic bonded body according to the present embodiment is an insulating circuit substrate 10 formed by bonding a ceramic substrate 11 as a ceramic member made of ceramics to a copper sheet 22 (circuit layer 12) and a copper sheet 23 (metal layer 13) as a copper member made of copper or a copper alloy. FIG. 1 shows a power module 1 including the insulating circuit substrate 10 according to the present embodiment.

The power module 1 includes the insulating circuit substrate 10 in which the circuit layer 12 and the metal layer 13 are disposed on the ceramic substrate 11, a semiconductor element 3 bonded to one surface (upper surface in FIG. 1) of the circuit layer 12 with a bonding layer 2 interposed therebetween, and a heat sink 30 disposed on the other side (lower side in FIG. 1) of the metal layer 13.

The semiconductor element 3 is made of a semiconductor material such as Si. The semiconductor element 3 and the circuit layer 12 are bonded to each other with the bonding layer 2 interposed therebetween.

The bonding layer 2 is made of, for example, a Sn—Ag-based, Sn-ln-based, or Sn—Ag—Cu-based solder material.

The heat sink 30 dissipates heat from the above-mentioned insulating circuit substrate 10. The heat sink 30 is made of Cu or a Cu alloy, and in the present embodiment, the heat sink 30 is made of phosphorus-deoxidized copper. The heat sink 30 is provided with a passage 31 through which a cooling fluid flows.

In the present embodiment, the heat sink 30 and the metal layer 13 are bonded to each other by a solder layer 32 made of a solder material. The solder layer 32 is made of, for example, a Sn—Ag-based, Sn—In-based, or Sn—Ag—Cu-based solder material.

As shown in FIG. 1, the insulating circuit substrate 10 according to the present embodiment includes the ceramic substrate 11, the circuit layer 12 disposed on one surface (upper surface in FIG. 1) of the ceramic substrate 11, and the metal layer 13 disposed on the other surface (lower surface in FIG. 1) of the ceramic substrate 11.

The ceramic substrate 11 is made of nitrogen-containing ceramics having excellent insulating properties and heat radiation, and in the present embodiment, the ceramic substrate 11 is made of aluminum nitride (AlN). The thickness of the ceramic substrate 11 is set to be in a range of, for example, 0.2 mm or more and 1.5 mm or less, and in the present embodiment, the thickness is set to 0.635 mm. In addition to aluminum nitride (AlN), silicon nitride can be used.

Figure 5:
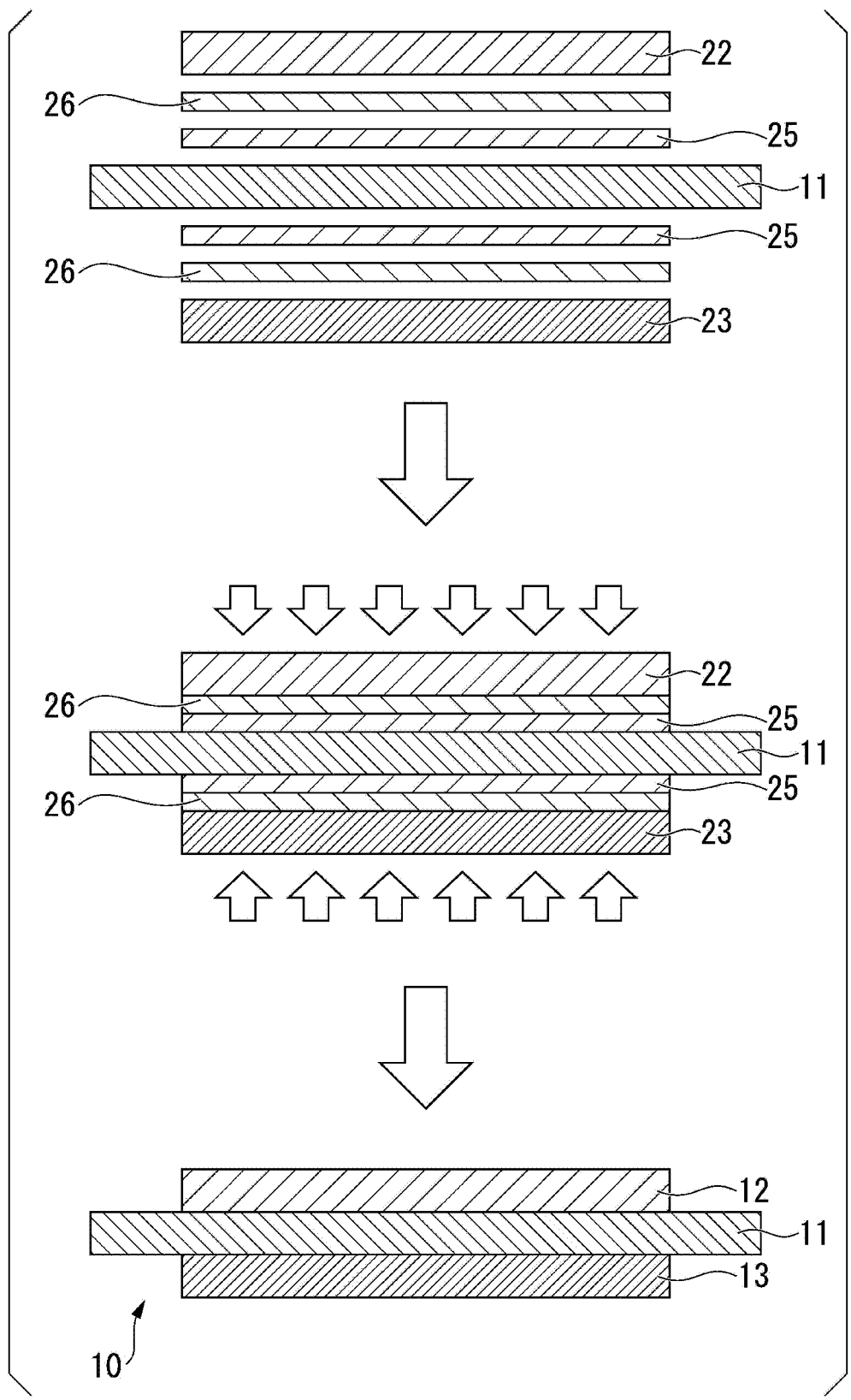
FIG. 5 is a schematic explanatory view of the method for producing the insulating circuit substrate according to the embodiment of the present invention.

As shown in FIG. 5, the circuit layer 12 is formed by bonding the copper sheet 22 made of copper or a copper alloy to one surface (upper surface in FIG. 5) of the ceramic substrate 11.

In the present embodiment, the circuit layer 12 is formed by bonding the copper sheet 22 made of a rolled plate of oxygen-free copper to the ceramic substrate 11.

The thickness of the copper sheet 22 serving as the circuit layer 12 is set to be in a range of 0.1 mm or more and 2.0 mm or less, and in the present embodiment, the thickness is set to 0.6 mm.

As shown in FIG. 5, the metal layer 13 is formed by bonding the copper sheet 23 made of copper or a copper alloy to the other surface (lower surface in FIG. 5) of the ceramic substrate 11.

In the present embodiment, the metal layer 13 is formed by bonding the copper sheet 23 made of a rolled plate of oxygen-free copper to the ceramic substrate 11.

The thickness of the copper sheet 23 serving as the metal layer 13 is set to be in a range of 0.1 mm or more and 2.0 mm or less, and in the present embodiment, the thickness is set to 0.6 mm.

Figure 2:
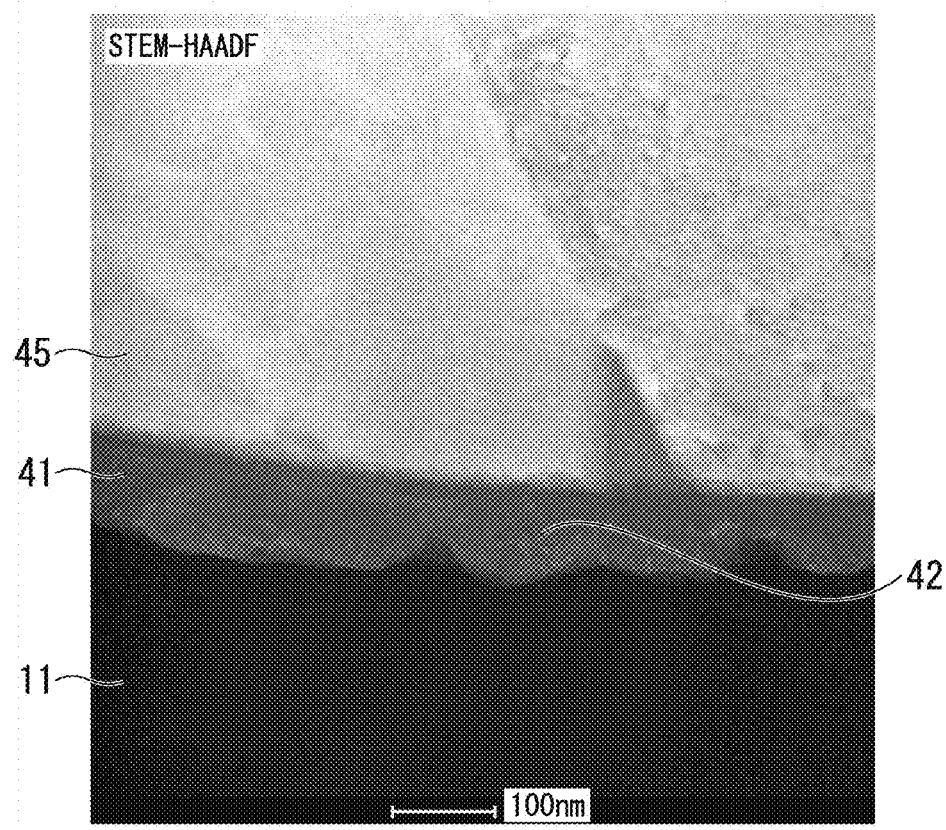
FIG. 2 is an observation result of a bonded interface between a circuit layer (metal layer) and a ceramic substrate of the insulating circuit substrate according to the embodiment of the present invention.
Figure 3:
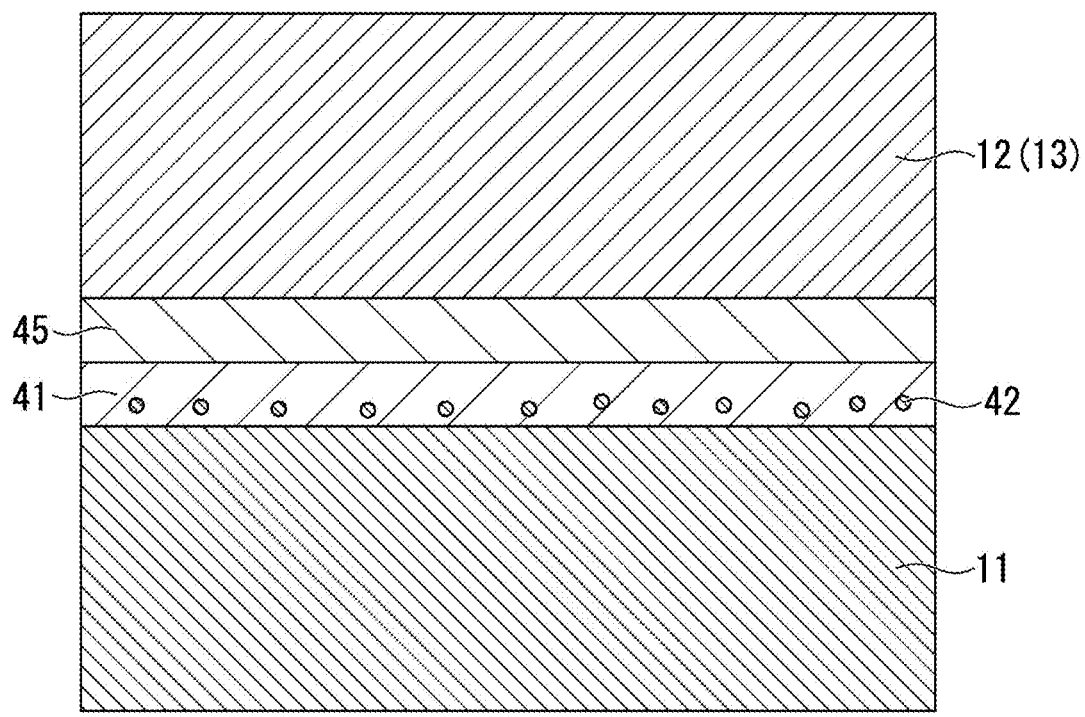
FIG. 3 is an enlarged explanatory view of the bonded interface between the circuit layer (metal layer) and the ceramic substrate of the insulating circuit substrate according to the embodiment of the present invention.

At the bonded interface between the ceramic substrate 11 and the circuit layer 12 (metal layer 13), as shown in FIGS. 2 and 3, an active metal nitride layer 41 composed of nitrides of one or more active metals selected from Ti, Zr, Nb, and Hf is formed on the ceramic substrate 11 side, and a Mg solid solution layer 45 is formed so as to be laminated on the active metal nitride layer 41.

With regard to the Mg solid solution layer 45, a region (400 μm in length×600 μm in width) including the bonded interface between the circuit layer 12 (metal layer 13) and the ceramic substrate 11 is observed under the conditions where a magnification is 2000 and an acceleration voltage is 15 kV by using an EPMA device (JXA-8539F manufactured by JEOL Ltd.), quantitative analysis is performed at 10 points at 10 intervals from the surface of the ceramic substrate 11 to the circuit layer 12 (metal layer 13) side, and the Mg solid solution layer 45 is a region in which a Mg concentration is 0.01 atomic % or more and 6.9 atomic % or less, where a Cu concentration+a Mg concentration=100 atomic %. The bonded interface is not measured. Accordingly, the Mg solid solution layer 45 is present in a region separated from the surface of the ceramic substrate 11 by 10 μm or more to the circuit layer 12 (metal layer 13) side.

In the present embodiment, Ti is preferably used as the active metal, and in this case, the active metal nitride layer 41 is made of titanium nitride (TiN).

In the present embodiment, the thickness of the active metal nitride layer 41 is preferably in a range of 50 nm or more and 1200 nm or less. The thickness of the active metal nitride layer 41 is more preferably 100 nm or more, and still more preferably 150 nm or more. On the other hand, the thickness of the active metal nitride layer 41 is more preferably 800 nm or less, and still more preferably 600 nm or less.

Cu-containing particles 42 composed of either one or both of Cu particles and compound particles of Cu and the active metal are dispersed in the interior of the active metal nitride layer 41.

The Cu-containing particles 42 are mostly present on the ceramic substrate 11 side of the active metal nitride layer 41, and 65% or more (number basis) of the Cu-containing particles 42 observed in the active metal nitride layer 41 are distributed in an interface-near-region from an interface with the ceramic substrate 11 to 500 nm in the active metal nitride layer 41. The proportion of the Cu-containing particles 42 distributed in the interface-near-region is more preferably 85% or more, still more preferably 95% or more, and the upper limit is 100%.

In the present embodiment, the particle size of the Cu-containing particles 42 is preferably in a range of 10 nm or more and 100 nm or less.

The equivalent circle diameter of the Cu-containing particles 42 dispersed in the interior of the active metal nitride layer 41 is preferably 15 nm or more, and more preferably 20 nm or more. On the other hand, the equivalent circle diameter of the Cu-containing particles 42 is preferably 70 nm or less, and more preferably 50 nm or less.

In the present embodiment, Mg may be present in the interior of the active metal nitride layer 41. In this case, the stress relaxation effect in the active metal nitride layer 41 can be obtained by Mg which is present in the interior of the active metal nitride layer 41, and the occurrence of breaking in the ceramic substrate 11 adjacent to the active metal nitride layer 41 can be further suppressed.

For the active metal nitride layer 41, the presence of Mg is defined as a case where the Mg concentration is 0.01 atomic % or more and 70 atomic % or less when Cu+Mg+ active metal (Ti, Zr, Nb, and Hf)=100 atomic % in STEM-EDX analysis.

In the present embodiment, it is preferable that a ratio C2/C1 of an average copper concentration C1 (atomic %) in a region from an interface on the ceramic substrate 11 side to a position of 25% of the total thickness of the active metal nitride layer 41 to an average copper concentration C2 (atomic %) in a region from an interface on the circuit layer 12 (metal layer 13) side to a position of 25% of the total thickness of the active metal nitride layer 41 is 0.8 or less.

The lower limit of the copper concentration ratio C2/C1 described above is not particularly limited, but is preferably 0.01 or more.

Figure 4:
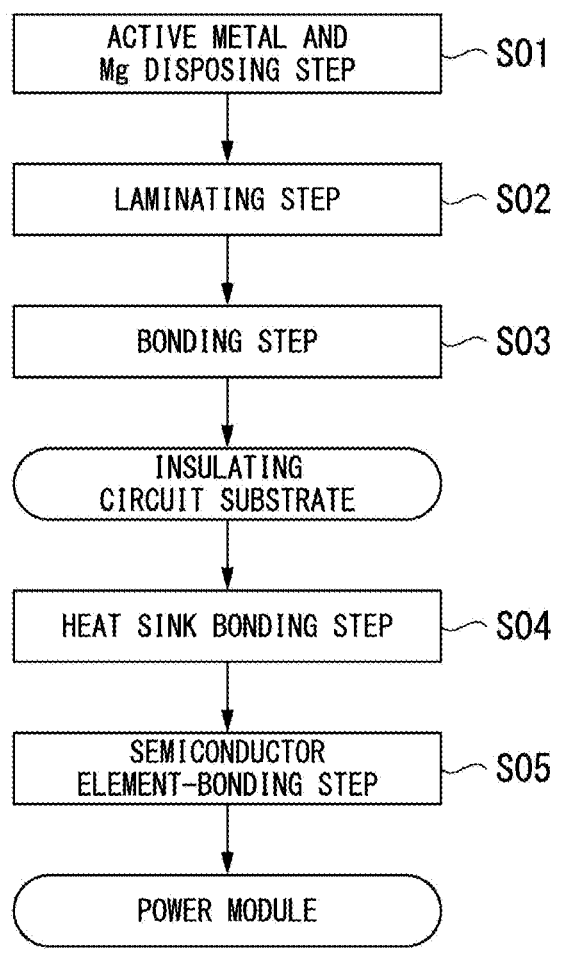
FIG. 4 is a flowchart of a method for producing the insulating circuit substrate according to the embodiment of the present invention.

Hereinafter, a method for producing the insulating circuit substrate 10 according to the present embodiment will be described with reference to FIGS. 4 and 5.

(Active Metal and Mg Disposing Step S01)

First, the ceramic substrate 11 made of aluminum nitride (AlN) is prepared, and as shown in FIG. 5, one or more active metals selected from Ti, Zr, Nb, and Hf and Mg are disposed between the copper sheet 22 serving as the circuit layer 12 and the ceramic substrate 11, and between the copper sheet 23 serving as the metal layer 13 and the ceramic substrate 11.

In the present embodiment, a Mg foil 25 and an active metal foil 26 are disposed between the copper sheet 22 serving as the circuit layer 12 and the ceramic substrate 11, and between the copper sheet 23 serving as the metal layer 13 and the ceramic substrate 11.

In the active metal and Mg disposing step SOI, the amount of the active metal to be disposed is set to be in a range of 0.4 μmol/cm$^2$ or more and 18.8 μmol/cm$^2$ or less, and an amount of Mg is set to be in a range of 14 mol/cm$^2$ or more and 86 mol/cm$^2$ or less.

The amount of the active metal to be disposed is preferably 0.9 μmol/cm$^2$ or more, and more preferably 2.8 μmol/cm$^2$ or more. On the other hand, the amount of the active metal to be disposed is preferably 9.4 mol/cm$^2$ or less, and more preferably 6.6 μmol/cm$^2$ or less.

In addition, the amount of Mg to be disposed is preferably 21 μmol/cm$^2$ or more, and more preferably 28 μmol/cm$^2$ or more. On the other hand, the amount of the Mg to be disposed is preferably 72 mol/cm$^2$ or less, and more preferably 57 μmol/cm$^2$ or less.

(Laminating Step S02)

Next, the copper sheet 22 and the ceramic substrate 11 are laminated with the active metal foil 26 and the Mg foil 25 interposed therebetween, and the ceramic substrate 11 and the copper sheet 23 are laminated with the active metal foil 26 and the Mg foil 25 interposed therebetween.

(Bonding Step S03)

Next, the copper sheet 22, the active metal foil 26, the Mg foil 25, the ceramic substrate 11, the Mg foil 25, the active metal foil 26, and the copper sheet 23 which are laminated are pressed in a lamination direction, and are loaded into a vacuum furnace and heated; and thereby, the copper sheet 22, the ceramic substrate 11, and the copper sheet 23 are bonded together.

The bonding step S03 includes an intermediate holding step of holding heating at an intermediate temperature of 440° C. or higher and lower than 480° C. for 30 minutes or longer and 150 minutes or shorter, and a high temperature holding step of holding the heating at a temperature of 700° C. or higher for 15 minutes or longer after the intermediate holding step.

By holding the heating at an intermediate temperature lower than a Cu—Mg eutectic temperature (484° C.), the ceramic substrate 11 reacts with Mg in a solid phase state at the bonded interface, a decomposition reaction of the ceramics proceeds, a liquid phase locally containing Mg is generated, and Mg enters the interior of the ceramic substrate 11.

When the holding temperature in the intermediate holding step is less than 440° C., the reaction between the ceramic substrate 11 and the active metal may be insufficient. When the holding temperature in the intermediate holding step is 480° C. or higher, a liquid phase is formed at the bonded interface, and the ceramic substrate 11 cannot react with Mg in a solid phase state, so that the Cu-containing particles 42 may not be sufficiently dispersed in the interior of the active metal nitride layer 41 in the high temperature holding step to be described below.

Accordingly, the holding temperature in the intermediate holding step is 440° C. or higher, preferably 445° C. or higher, and more preferably 450° C. or higher. On the other hand, the holding temperature in the intermediate holding step is less than 480° C., preferably 475° C. or lower, and more preferably 470° C. or lower.

When the holding time in the intermediate holding step is shorter than 30 minutes, the reaction between the ceramic substrate 11 and the active metal may be insufficient. When the holding time in the intermediate holding step exceeds 150 minutes, the reaction in the solid phase state may proceed excessively, and the copper sheets 22 and 23 and the ceramic substrate 11 may not be bonded to each other.

Accordingly, the holding time in the intermediate holding step is 30 minutes or longer, preferably 45 minutes or longer, and more preferably 60 minutes or longer. On the other hand, the holding time in the intermediate holding step is 150 minutes or shorter, preferably 120 minutes or shorter, and more preferably 90 minutes or shorter.

After the intermediate holding step, a liquid phase is formed at the bonded interface by the high temperature holding step of holding the heating at the temperature of 700° C. or higher for 15 minutes or longer, the active metal nitride layer 41 is formed, and the ceramic substrate 11 and the copper sheets 22 and 23 are firmly bonded to each other. In addition, in the interior of the ceramic substrate 11, a Cu—Mg liquid phase is formed starting from a portion where Mg enters, Cu enters the interior of the ceramic substrate 11, and the Cu-containing particles are dispersed.

When the heating temperature in the high temperature holding step is lower than 700° C., a sufficient liquid phase cannot be secured, and the ceramic substrate 11 and the copper sheets 22 and 23 may not be firmly bonded to each other.

Accordingly, the heating temperature in the high temperature holding step is 700° C. or higher, preferably 730° C. or higher, and more preferably 750° C. or higher. The heating temperature in the high temperature holding step is preferably 850° C. or lower, and more preferably 830° C. or lower.

When the holding time in the high temperature holding step is shorter than 15 minutes, the ceramic substrate 11 and the copper sheets 22 and 23 may not be firmly bonded to each other.

Accordingly, the holding time in the high temperature holding step is 15 minutes or longer, preferably 30 minutes or longer, and more preferably 45 minutes or longer. The holding time in the high temperature holding step is preferably 150 minutes or shorter, and more preferably 120 minutes or shorter.

As described above, the insulating circuit substrate 10 according to the present embodiment is produced by the active metal and Mg disposing step S01, the laminating step S02, and the bonding step S03.

(Heat Sink Bonding Step S04)

Next, the heat sink 30 is bonded to the other surface side of the metal layer 13 of the insulating circuit substrate 10.

The insulating circuit substrate 10 and the heat sink 30 are laminated with a solder material interposed therebetween and are loaded into a heating furnace such that the insulating circuit substrate 10 and the heat sink 30 are solder-bonded to each other with the solder layer 32 interposed therebetween.

(Semiconductor Element-Bonding Step S05)

Next, the semiconductor element 3 is bonded to one surface of the circuit layer 12 of the insulating circuit substrate 10 by soldering.

The power module 1 shown in FIG. 1 is produced by the above-described steps.

According to the insulating circuit substrate 10 (copper/ceramic bonded body) of the present embodiment having the above-described configuration, since the active metal nitride layer 41 containing the nitrides of one or more active metals selected from Ti, Zr, Nb, and Hf is formed on the ceramic substrate 11 side, and the Mg solid solution layer 45 in which Mg is solid-dissolved in the Cu matrix is formed between the active metal nitride layer 41 and the circuit layer 12 (metal layer 13), sufficient interfacial reaction proceeds, and the circuit layer 12 (metal layer 13) and the ceramic substrate 11 are firmly bonded to each other.

In the present embodiment, since the Cu-containing particles 42 composed of either one or both of the Cu particles and the compound particles of Cu and the active metal are dispersed in the interior of the active metal nitride layer 41, the stress in the hard active metal nitride layer 41 can be relaxed during loading of a thermal cycle, and the occurrence of breaking in the ceramic substrate 11 adjacent to the active metal nitride layer 41 can be suppressed.

In the present embodiment, when the Cu-containing particles 42 have the particle size in the range of 10 nm or more and 100 nm or less, the stress relaxation effect in the active metal nitride layer 41 by the Cu-containing particle 42 can be sufficiently exerted, and the occurrence of breaking in the ceramic substrate 11 adjacent to the active metal nitride layer 41 can be further suppressed.

In the present embodiment, when Mg is present in the interior of the active metal nitride layer 41, the stress relaxation effect in the active metal nitride layer 41 can be obtained by Mg, and the occurrence of breaking in the ceramic substrate 11 adjacent to the active metal nitride layer 41 can be further suppressed.

In the present embodiment, when the ratio C2/C1 of the average copper concentration C1 (atomic %) in the region from the interface on the ceramic substrate 11 side to the position of 25% of the total thickness of the active metal nitride layer 41 to the average copper concentration C2 (atomic %) in the region from the interface on the circuit layer 12 (metal layer 13) side to the position of 25% of the total thickness of the active metal nitride layer 41 is 0.8 or less, the copper concentration on the ceramic substrate 11 side is higher than the copper concentration on the circuit layer 12 (metal layer 13) side in the active metal nitride layer 41, so that the interfacial reaction sufficiently proceeds, and the circuit layer 12 (metal layer 13) and the ceramic substrate 11 are more firmly bonded to each other.

According to the method for producing an insulating circuit substrate according to the present embodiment, in the active metal and Mg disposing step S01, the amount of the active metal is set to be in the range of 0.4 µmol/cm$^2$ or more and 18.8 µmol/cm$^2$ or less, and the amount of Mg is set to be in the range of 14 µmol/cm$^2$ or more and 86 µmol/cm$^2$ or less, so that a sufficient liquid phase required for an interfacial reaction can be obtained. Accordingly, the copper sheets 22 and 23 and the ceramic substrate 11 can be reliably bonded to each other.

In the bonding step S03, the heating is held at the intermediate temperature of 440° C. or higher and lower than 480° C. for 30 minutes or longer and 150 minutes or shorter, and then the heating is held at the temperature of 700° C. or higher for 15 minutes or longer, so that, when the heating is held at the intermediate temperature described above, the decomposition reaction of the ceramics proceeds in a solid phase state, a liquid phase locally containing Mg is generated, and Mg enters the interior of the ceramic substrate 11.

Since the heating is held at the temperature of 700° C. or higher for 15 minutes or longer after being held at the intermediate temperature, the active metal nitride layer 41 is formed. In addition, in the interior of the ceramic substrate 11, a Cu—Mg liquid phase is formed starting from a portion where Mg enters, Cu enters the interior of the ceramic substrate 11, and the Cu-containing particles are dispersed.

The embodiment of the present invention has been described, but the present invention is not limited thereto, and can be appropriately changed without departing from the technical features of the present invention.

For example, in the present embodiment, the semiconductor element is mounted on the insulating circuit substrate to form the power module, but the present embodiment is not limited thereto. For example, an LED element may be mounted on the circuit layer of the insulating circuit substrate to form an LED module, or a thermoelectric element may be mounted on the circuit layer of the insulating circuit substrate to form a thermoelectric module.

In the insulating circuit substrate of the present embodiment, it has been described that both of the circuit layer and the metal layer are copper sheets made of copper or a copper alloy, but the present invention is not limited thereto.

For example, in a case where the circuit layer and the ceramic substrate are made of the copper/ceramic bonded body according to the present invention, there is no limitation on the material and the bonding method of the metal layer. There may be no metal layer, the metal layer may be made of aluminum or an aluminum alloy, or may be made of a laminate of copper and aluminum.

On the other hand, in a case where the metal layer and the ceramic substrate are made of the copper/ceramic bonded body according to the present invention, there is no limitation on the material and the bonding method of the circuit layer. The circuit layer may be made of aluminum or an aluminum alloy, or may be made of a laminate of copper and aluminum.

In the present embodiment, the configuration has been described in which the active metal foil and the Mg foil are laminated between the copper sheet and the ceramic substrate, but the present invention is not limited thereto, and an alloy foil of Mg and the active metal may be disposed. A thin film made of Mg, the active metal, an alloy of Mg and the active metal, or the like may be formed on the bonding surface between the ceramic substrate and the copper sheet by a sputtering method, a vapor deposition method, or the like. A paste using Mg or MgH$_2$, a paste using an active metal or an active metal hydride, or a mixed paste thereof may also be used.

In the present embodiment, a pressing load in the bonding step S03 is preferably in a range of 0.049 MPa or more and 3.4 MPa or less. A degree of vacuum in the bonding step S03 is preferably in a range of $1\times10^{-6}$ Pa or more and $5\times10^{-2}$ Pa or less.

EXAMPLES

Hereinafter, results of confirmation experiments performed to confirm the effects of the present invention will be described.

Example 1

First, ceramic substrates (40 mm×40 mm) shown in Tables 1 and 2 were prepared. In Invention Examples 1 to 4 and Comparative Examples 1 to 5, aluminum nitride (AlN) having a thickness of 0.635 mm was used, and in Invention Examples 11 to 14 and Comparative Examples 11 to 15, silicon nitride (Si$_3$N$_4$) having a thickness of 0.32 mm was used.

A copper sheet (37 mm×37 mm×thickness of 0.3 mm) made of oxygen-free copper was bonded to both surfaces of the ceramic substrate under the conditions shown in Tables 1 and 2 to obtain an insulating circuit substrate (copper/ceramic bonded body). A degree of vacuum of a vacuum furnace at the time of bonding was set to $6\times10^{-3}$ Pa.

For the obtained insulating circuit substrate (copper/ceramic bonded body), the presence or absence of a Mg solid solution layer at a bonded interface, the presence or absence and the equivalent circle diameter of Cu-containing particles (either one or both of Cu particles and compound particles of Cu and an active metal) in an active metal nitride layer, the presence or absence of Mg in the active metal nitride layer, and the presence or absence of breaking in the ceramic substrate after loading of a thermal cycle were evaluated as follows.

(Mg Solid Solution Layer)

A region (400 µm in length×600 µm in width) including the bonded interface between the copper sheet and the ceramic substrate was observed under the conditions where a magnification was 2000 and an acceleration voltage was 15 kV by using an EPMA device (JXA-8539F manufactured by JEOL Ltd.), quantitative analysis was performed at 10 points at 10 µm intervals from the surface of the ceramic substrate to the copper sheet side, and a region having a Mg concentration of 0.01 atomic % or more and 6.9 atomic % or less, where a Cu concentration+a Mg concentration=100 atomic %, was taken as a Mg solid solution layer. The measurement was performed in 5 fields of view, and a case where the Mg solid solution layer was observed even in one place was indicated as "Present" in Tables 3 and 4.

(Active Metal Nitride Layer)

The bonded interface between the copper sheet and the ceramic substrate was observed using an electron scanning microscope (ULTRA55 manufactured by Carl Zeiss NTS GmbH) at a magnification of 15000 (measurement range: 6 μm×8 μm) and in five fields of view, to confirm the presence or absence of the active metal nitride layer and confirm the presence or absence of the Cu-containing particles in the active metal nitride layer. In addition, the equivalent circle diameter of the observed Cu-containing particles was calculated.

The presence or absence of Mg in the active metal nitride layer was confirmed. The presence or absence of Mg in the active metal nitride layer was confirmed by the above-described method. The measurement was performed in 5 fields of view, and a case where Mg was observed even in one place was indicated as "Present" in Tables 3 and 4.

(Breaking in Ceramic Substrate)

After loading a thermal cycle of −78° C.×2 minutes↔350° C.×2 minutes, the bonded interface between the copper sheet and the ceramic substrate was inspected by SAT inspection, and the number of cycles in which ceramic breaking was confirmed was evaluated.

In Invention Examples 1 to 4 and Comparative Examples 1 and 2 in which aluminum nitride (AlN) was used as the ceramic substrate, the above-described thermal cycle was performed up to 10 cycles, and a case where no breaking was confirmed after 10 cycles was indicated as ">10".

In Invention Examples 11 to 14 and Comparative Examples 11 and 12 in which silicon nitride ($Si_3N_4$) was used as the ceramic substrate, the above-described thermal cycle was performed up to 20 cycles, and a case where no breaking was confirmed after 20 cycles was indicated as ">20".

TABLE 1

| | | Mg and active metal disposing step | | | Bonding condition | | | |
| | | | | | Intermediate holding step | | High temperature holding step | |
| | Ceramic | Amount of Mg | Active metal | | Load | Holding temperature | Holding time | Holding temperature | Holding time |
| | substrate | μmol/cm² | Element | μmol/cm² | MPa | ° C. | min | ° C. | min |
|---|---|---|---|---|---|---|---|---|---|
| Invention Example 1 | AlN | 29 | Hf | 6.6 | 1.47 | 460 | 120 | 700 | 15 |
| Invention Example 2 | AlN | 14 | Ti | 0.4 | 3.4 | 460 | 60 | 730 | 120 |
| Invention Example 3 | AlN | 43 | Ti | 4.7 | 0.294 | 440 | 60 | 750 | 90 |
| Invention Example 4 | AlN | 72 | Nb | 0.9 | 0.98 | 460 | 60 | 730 | 45 |
| Comparative Example 1 | AlN | 43 | Ti | 4.7 | 0.294 | — | — | 750 | 90 |
| Comparative Example 2 | AlN | 72 | Nb | 0.9 | 0.98 | 200 | 90 | 730 | 45 |
| Comparative Example 3 | AlN | 7 | Ti | 4.7 | 0.98 | 440 | 60 | 750 | 90 |
| Comparative Example 4 | AlN | 72 | Nb | 0.1 | 0.98 | 440 | 60 | 750 | 90 |
| Comparative Example 5 | AlN | 29 | Hf | 6.6 | 1.47 | 520 | 120 | 700 | 15 |

TABLE 2

| | | Mg and active metal disposing step | | | Bonding condition | | | |
| | | | | | Intermediate holding step | | High temperature holding step | |
| | Ceramic | Amount of Mg | Active metal | | Load | Holding temperature | Holding time | Holding temperature | Holding time |
| | substrate | μmol/cm² | Element | μmol/cm² | MPa | ° C. | min | ° C. | min |
|---|---|---|---|---|---|---|---|---|---|
| Invention Example 11 | $Si_3N_4$ | 86 | Zr | 18.8 | 0.049 | 440 | 30 | 730 | 90 |
| Invention Example 12 | $Si_3N_4$ | 57 | Ti | 4.7 | 0.294 | 440 | 90 | 850 | 120 |
| Invention Example 13 | $Si_3N_4$ | 43 | Hf | 6.6 | 0.294 | 440 | 150 | 800 | 60 |

TABLE 2-continued

| | | Mg and active metal disposing step | | | Bonding condition | | | |
| | | | | | Intermediate holding step | | High temperature holding step | |
| | Ceramic substrate | Amount of Mg μmol/cm² | Active metal Element | Active metal μmol/cm² | Load MPa | Holding temperature °C | Holding time min | Holding temperature °C | Holding time min |
|---|---|---|---|---|---|---|---|---|---|
| Invention Example 14 | Si₃N₄ | 29 | Zr | 4.7 | 0.98 | 480 | 90 | 830 | 60 |
| Comparative Example 11 | Si₃N₄ | 43 | Hf | 6.6 | 0.294 | 440 | 5 | 800 | 60 |
| Comparative Example 12 | Si₃N₄ | 29 | Zr | 4.7 | 0.98 | 440 | 500 | 830 | 60 |
| Comparative Example 13 | Si₃N₄ | 7 | Ti | 6.6 | 1.47 | 460 | 60 | 830 | 60 |
| Comparative Example 14 | Si₃N₄ | 29 | Ti | 0.2 | 0.98 | 460 | 60 | 830 | 60 |
| Comparative Example 15 | Si₃N₄ | 43 | Zr | 4.7 | 0.98 | 520 | 60 | 830 | 60 |

TABLE 3

| | Presence or absence of Mg solid solution layer | Active metal nitride layer | | | Presence or absence of breaking in ceramic substrate after loading of thermal cycle |
| | | Cu-containing particles | | | |
| | | Presence or absence | Size (nm) | Presence or absence of Mg | |
|---|---|---|---|---|---|
| Invention Example 1 | Present | Present | 109 | Absent | 6 |
| Invention Example 2 | Present | Present | 74 | Present | >10 |
| Invention Example 3 | Present | Present | 30 | Present | 9 |
| Invention Example 4 | Present | Present | 48 | Present | >10 |
| Comparative Example 1 | Present | Absent | — | Absent | 3 |
| Comparative Example 2 | Present | Absent | — | Absent | 2 |
| Comparative Example 3 | — | — | — | — | — |
| Comparative Example 4 | — | — | — | — | — |
| Comparative Example 5 | — | — | — | — | — |

TABLE 4

| | Presence or absence of Mg solid solution layer | Active metal nitride layer | | | Presence or absence of breaking in ceramic substrate after loading of thermal cycle |
| | | Cu-containing particles | | | |
| | | Presence or absence | Size (nm) | Presence or absence of Mg | |
|---|---|---|---|---|---|
| Invention Example 11 | Present | Present | 11 | Absent | 16 |
| Invention Example 12 | Present | Present | 97 | Absent | 17 |
| Invention Example 13 | Present | Present | 47 | Present | >20 |

TABLE 4-continued

|  | | Active metal nitride layer | | | Presence or |
|---|---|---|---|---|---|
|  | Presence or | Cu-containing particles | | | absence of breaking in |
|  | absence of Mg solid solution layer | Presence or absence | Size (nm) | Presence or absence of Mg | ceramic substrate after loading of thermal cycle |
| Invention Example 14 | Present | Present | 21 | Present | 20 |
| Comparative Example 11 | Present | Absent | — | Present | 12 |
| Comparative Example 12 | — | — | — | — | — |
| Comparative Example 13 | — | — | — | — | — |
| Comparative Example 14 | — | — | — | — | — |
| Comparative Example 15 | — | — | — | — | — |

In Comparative Example 1 in which the intermediate temperature holding step was not performed, the Cu-containing particles were not present in the active metal nitride layer, and breaking in the ceramic substrate occurred after loading of a thermal cycle.

In Comparative Example 2 in which the holding temperature in the intermediate temperature holding step was as low as 200° C., the Cu-containing particles were not present in the active metal nitride layer, and breaking in the ceramic substrate occurred after loading of a thermal cycle.

In Comparative Example 11 in which the holding time in the intermediate temperature holding step was as short as 5 minutes, the Cu-containing particles were not present in the active metal nitride layer, and breaking in the ceramic substrate occurred after loading of a thermal cycle.

In Comparative Example 3 and Comparative Example 13 in which the amount of Mg was as small as 7 μmol/cm$^2$, Comparative Example 4 in which the amount of the active metal was as small as 0.1 mol/cm$^2$, Comparative Example 5 and Comparative Example 15 in which the holding temperature in the intermediate temperature holding step was as high as 520° C., Comparative Example 12 in which the holding time in the intermediate temperature holding step was as long as 500 minutes, and Comparative Example 14 in which the amount of the active metal was as small as 0.2 mol/cm$^2$, the copper sheet and the ceramic substrate could not be bonded to each other. Therefore, subsequent evaluations were discontinued.

On the other hand, in Invention Examples 1 to 4 and 11 to 14 in which the Cu-containing particles were dispersed in the active metal nitride layer, no breaking in the ceramic substrate was confirmed after loading of a thermal cycle.

Example 2

Next, ceramic substrates (40 mm×40 mm) shown in Tables 5 and 6 were prepared. In Invention Examples 21 to 28, aluminum nitride (AlN) having a thickness of 0.635 mm was used, and in Invention Examples 31 to 38, silicon nitride (Si$_3$N$_4$) having a thickness of 0.32 mm was used.

A copper sheet (37 mm×37 mm×thickness of 0.3 mm) made of oxygen-free copper was bonded to both surfaces of the ceramic substrate under the conditions shown in Tables 5 and 6 to obtain an insulating circuit substrate (copper/ceramic bonded body). A degree of vacuum of a vacuum furnace at the time of bonding was set to 6×10$^{-3}$ Pa. For the obtained insulating circuit substrate (copper/ceramic bonded body), the presence or absence of a Mg solid solution layer at a bonded interface and the presence or absence of Cu-containing particles (either one or both of Cu particles and compound particles of Cu and an active metal) in an active metal nitride layer were evaluated by the method described in Example 1. The copper concentration in the active metal nitride layer and the presence or absence of breaking in the ceramic substrate after loading of a thermal cycle were evaluated as follows.

(Copper Concentration in Active Metal Nitride Layer)
Line analysis of Cu, Mg, N, and an active metal (Ti, Zr, Nb, and Hf) in the thickness direction was performed on the bonded interface between the copper sheet and the ceramic substrate at an acceleration voltage of 200 kV and at a magnification of 20000 to 200000 by using a scanning transmission electron microscope (Titan ChemiSTEM manufactured by FEI Company). A graph was created with the vertical axis representing the copper concentration (copper concentration when the total amount of Cu, Mg, N, and an active metal was 100 atomic %) and the horizontal axis representing the measurement position.

An interface position of the active metal nitride layer was defined as a position where a nitride-forming element was 10 atomic % or more for the first time when viewed from the ceramic substrate or the copper sheet. A concentration ratio C2/C1 was calculated by taking an average value of the copper concentration in a region from an interface on the ceramic substrate side to a position of 25% of the total thickness of the active metal nitride layer as C1, and taking an average value of the copper concentration in a region from an interface on the copper sheet side to a position of 25% of the total thickness of the active metal nitride layer as C2. The measurement was performed in 5 fields of view and one line of measurement was performed in each field of view, and an average value of the obtained concentration ratios C2/C1 was obtained and shown in Tables 7 and 8.

(Breaking in Ceramic Substrate)
After loading a thermal cycle of −78° C.×5 minutes↔350° C.×5 minutes, the bonded interface between the copper sheet and the ceramic substrate was inspected by SAT inspection, and the number of cycles in which ceramic breaking was confirmed was evaluated.

In Invention Examples 21 to 28 in which aluminum nitride (AlN) was used as the ceramic substrate, the above-described thermal cycle was performed up to 8 cycles, and a case where no breaking was confirmed after 8 cycles was indicated as ">8".

In Invention Examples 31 to 38 in which silicon nitride ($Si_3N_4$) was used as the ceramic substrate, the above-described thermal cycle was performed up to 16 cycles, and a case where no breaking was confirmed after 16 cycles was indicated as ">16".

TABLE 5

| | | | | | Bonding condition | | | |
| | | | | | Intermediate holding step | | High temperature holding step | |
| | | Mg and active metal disposing step | | | Holding | Holding | Holding | Holding |
| | Ceramic | Amount of Mg | Active metal | | Load | temperature | time | temperature | time |
| | substrate | μmol/cm² | Element | μmol/cm² | MPa | °C. | min | °C. | min |
|---|---|---|---|---|---|---|---|---|---|
| Invention Example 21 | AlN | 14 | Ti | 0.4 | 3.4 | 470 | 60 | 750 | 120 |
| Invention Example 22 | AlN | 14 | Ti | 0.4 | 3.4 | 460 | 90 | 800 | 90 |
| Invention Example 23 | AlN | 14 | Ti | 0.4 | 3.4 | 450 | 120 | 830 | 120 |
| Invention Example 24 | AlN | 43 | Zr | 4.7 | 0.294 | 450 | 90 | 800 | 60 |
| Invention Example 25 | AlN | 43 | Zr | 4.7 | 0.294 | 470 | 60 | 830 | 30 |
| Invention Example 26 | AlN | 43 | Zr | 4.7 | 0.294 | 470 | 120 | 830 | 90 |
| Invention Example 27 | AlN | 72 | Nb | 0.9 | 1.96 | 450 | 90 | 750 | 90 |
| Invention Example 28 | AlN | 72 | Hf | 0.9 | 0.98 | 450 | 60 | 750 | 60 |

TABLE 6

| | | | | | Bonding condition | | | |
| | | | | | Intermediate holding step | | High temperature holding step | |
| | | Mg and active metal disposing step | | | Holding | Holding | Holding | Holding |
| | Ceramic | Amount of Mg | Active metal | | Load | temperature | time | temperature | time |
| | substrate | μmol/cm² | Element | μmol/cm² | MPa | °C. | min | °C. | min |
|---|---|---|---|---|---|---|---|---|---|
| Invention Example 31 | $Si_3N_4$ | 57 | Ti | 4.7 | 0.294 | 450 | 90 | 750 | 60 |
| Invention Example 32 | $Si_3N_4$ | 57 | Ti | 4.7 | 0.294 | 450 | 90 | 830 | 45 |
| Invention Example 33 | $Si_3N_4$ | 57 | Ti | 4.7 | 0.294 | 450 | 90 | 830 | 90 |
| Invention Example 34 | $Si_3N_4$ | 29 | Zr | 4.7 | 0.98 | 460 | 60 | 830 | 120 |
| Invention Example 35 | $Si_3N_4$ | 29 | Zr | 4.7 | 0.98 | 470 | 60 | 800 | 90 |
| Invention Example 36 | $Si_3N_4$ | 29 | Zr | 4.7 | 0.98 | 470 | 90 | 800 | 60 |
| Invention Example 37 | $Si_3N_4$ | 43 | Nb | 6.6 | 0.294 | 450 | 120 | 750 | 90 |
| Invention Example 38 | $Si_3N_4$ | 43 | Hf | 6.6 | 0.147 | 470 | 90 | 800 | 120 |

TABLE 7

| | Presence or absence of Mg solid solution layer | Active metal nitride layer | | | | Presence or absence of breaking in ceramic substrate after loading of thermal cycle |
|---|---|---|---|---|---|---|
| | | Presence or absence of Cu-containing particles | Copper concentration | | | |
| | | | C1 (atomic %) | C2 (atomic %) | C2/C1 | |
| Invention Example 21 | Present | Present | 11.8 | 0.8 | 0.07 | 8 |
| Invention Example 22 | Present | Present | 9.0 | 1.8 | 0.20 | 7 |
| Invention Example 23 | Present | Present | 14.4 | 0.2 | 0.01 | >8 |
| Invention Example 24 | Present | Present | 5.9 | 2.9 | 0.49 | 7 |
| Invention Example 25 | Present | Present | 1.3 | 1.0 | 0.77 | 8 |
| Invention Example 26 | Present | Present | 11.2 | 2.3 | 0.21 | 8 |
| Invention Example 27 | Present | Present | 9.5 | 2.0 | 0.21 | 7 |
| Invention Example 28 | Present | Present | 4.2 | 3.6 | 0.86 | 5 |

TABLE 8

| | Presence or absence of Mg solid solution layer | Active metal nitride layer | | | | Presence or absence of breaking in ceramic substrate after loading of thermal cycle |
|---|---|---|---|---|---|---|
| | | Presence or absence of Cu-containing particles | Copper concentration | | | |
| | | | C1 (atomic %) | C2 (atomic %) | C2/C1 | |
| Invention Example 31 | Present | Present | 4.5 | 3.1 | 0.69 | 14 |
| Invention Example 32 | Present | Present | 4.3 | 2.9 | 0.67 | 15 |
| Invention Example 33 | Present | Present | 10.6 | 1.4 | 0.13 | >16 |
| Invention Example 34 | Present | Present | 14.8 | 0.4 | 0.03 | >16 |
| Invention Example 35 | Present | Present | 12.3 | 2.1 | 0.17 | 16 |
| Invention Example 36 | Present | Present | 9.2 | 3.4 | 0.37 | 15 |
| Invention Example 37 | Present | Present | 8.8 | 2.5 | 0.28 | 16 |
| Invention Example 38 | Present | Present | 13.1 | 1.2 | 0.09 | >16 |

In Invention Examples 21 to 27 in which the copper concentration ratio C2/C1 in the active metal nitride layer was 0.8 or less, it was confirmed that, compared with Invention Example 28 in which the copper concentration ratio C2/C1 exceeded 0.8, the occurrence of breaking during loading of the thermal cycle could be suppressed.

In Invention Examples 31 to 38, when performing comparison between the same active elements, it was confirmed that the smaller the copper concentration ratio C2/C1 in the active metal nitride layer, the more the occurrence of breaking during loading of the thermal cycle could be suppressed.

As a result, according to Invention Examples, it was confirmed that is possible to provide a copper/ceramic bonded body, an insulating circuit substrate, a method for producing a copper/ceramic bonded body, and a method for producing an insulating circuit substrate, which can suppress occurrence of breaking in a ceramic substrate even when severe thermal cycle is loaded, and are excellent in reliability of a thermal cycle.

INDUSTRIAL APPLICABILITY

According to the invention, it is possible to provide a copper/ceramic bonded body, an insulating circuit substrate, a method for producing a copper/ceramic bonded body, and a method for producing an insulating circuit substrate, which can suppress occurrence of breaking in a ceramic substrate even when severe thermal cycle is loaded, and are excellent in reliability of a thermal cycle.

EXPLANATION OF REFERENCE SIGNS

10: Insulating circuit substrate (copper/ceramic bonded body)

11: Ceramic substrate (ceramic member)
12: Circuit layer (copper member)
13: Metal layer (copper member)
41: Active metal nitride layer
42: Cu-containing particles (Cu particles and compound particles of Cu and active metal)
45: Mg solid solution layer

What is claimed is:

1. A copper/ceramic bonded body comprising:
a copper member made of copper or a copper alloy; and
a ceramic member made of nitrogen-containing ceramics, the copper member and the ceramic member being bonded to each other,
wherein, between the copper member and the ceramic member, an active metal nitride layer containing nitrides of one or more active metals selected from Ti, Zr, Nb, and Hf is formed on a ceramic member side, and a Mg solid solution layer in which Mg is solid-dissolved in a Cu matrix is formed between the active metal nitride layer and the copper member,
Cu-containing particles composed of either one or both of Cu particles and compound particles of Cu and the active metal are dispersed in an interior of the active metal nitride layer, and
a ratio C2/C1 of an average copper concentration C1 (atomic %) in a region from an interface on a ceramic member side to a position of 25% of a total thickness of the active metal nitride layer to an average copper concentration C2 (atomic %) in a region from an interface on a copper member side to a position of 25% of the total thickness of the active metal nitride layer is 0.8 or less.

2. The copper/ceramic bonded body according to claim 1, wherein the Cu-containing particles have a particle size in a range of 10 nm or more and 100 nm or less.

3. The copper/ceramic bonded body according to claim 1, wherein Mg is present in the interior of the active metal nitride layer.

4. A method for producing the copper/ceramic bonded body according to claim 1, the method comprising:
an active metal and Mg disposing step of disposing one or more active metals selected from Ti, Zr, Nb, and Hf and Mg between a copper member and a ceramic member;
a laminating step of laminating the copper member and the ceramic member with the active metal and Mg interposed therebetween; and
a bonding step of performing a heating treatment on the laminated copper member and ceramic member with the active metal and Mg interposed therebetween in a state of being pressed in a lamination direction under a vacuum atmosphere to bond the copper member and the ceramic member to each other,
wherein, in the active metal and Mg disposing step, an amount of the active metal is set to be in a range of 0.4 µmol/cm$^2$ or more and 18.8 µmol/cm$^2$ or less, and an amount of Mg is set to be in a range of 14 µmol/cm$^2$ or more and 86 µmol/cm$^2$ or less, and
in the bonding step, heating is held at an intermediate temperature of 440° C. or higher and lower than 480° C. for 30 minutes or longer and 150 minutes or shorter, and then heating is held at a temperature of 700° C. or higher for 15 minutes or longer.

5. An insulating circuit substrate comprising:
a copper sheet made of copper or a copper alloy; and
a ceramic substrate made of nitrogen-containing ceramics, the copper sheet being bonded to a surface of the ceramic substrate,
wherein, between the copper sheet and the ceramic substrate, an active metal nitride layer containing nitrides of one or more active metals selected from Ti, Zr, Nb, and Hf is formed on a ceramic substrate side, and a Mg solid solution layer in which Mg is solid-dissolved in a Cu matrix is formed between the active metal nitride layer and the copper sheet,
Cu-containing particles composed of either one or both of Cu particles and compound particles of Cu and the active metal are dispersed in an interior of the active metal nitride layer, and
a ratio C2/C1 of an average copper concentration C1 (atomic %) in a region from an interface on a ceramic substrate side to a position of 25% of a total thickness of the active metal nitride layer to an average copper concentration C2 (atomic %) in a region from an interface on a copper sheet side to a position of 25% of the total thickness of the active metal nitride layer is 0.8 or less.

6. The insulating circuit substrate according to claim 5, wherein the Cu-containing particles have a particle size in a range of 10 nm or more and 100 nm or less.

7. The insulating circuit substrate according to claim 5, wherein Mg is present in the interior of the active metal nitride layer.

8. A method for producing the insulating circuit substrate according to claim 5, the method comprising:
an active metal and Mg disposing step of disposing one or more active metals selected from Ti, Zr, Nb, and Hf and Mg between a copper sheet and a ceramic substrate;
a laminating step of laminating the copper sheet and the ceramic substrate with the active metal and Mg interposed therebetween; and
a bonding step of performing a heating treatment on the laminated copper sheet and ceramic substrate with the active metal and Mg interposed therebetween in a state of being pressed in a lamination direction under a vacuum atmosphere to bond the copper sheet and the ceramic substrate to each other,
wherein, in the active metal and Mg disposing step, an amount of the active metal is set to be in a range of 0.4 µmol/cm$^2$ or more and 18.8 µmol/cm$^2$ or less, and an amount of Mg is set to be in a range of 14 µmol/cm$^2$ or more and 86 µmol/cm$^2$ or less, and
in the bonding step, heating is held at an intermediate temperature of 440° C. or higher and lower than 480° C. for 30 minutes or longer and 150 minutes or shorter, and then heating is held at a temperature of 700° C. or higher for 15 minutes or longer.

\* \* \* \* \*